United States Patent
Kyung et al.

(10) Patent No.: US 7,908,541 B2
(45) Date of Patent: Mar. 15, 2011

(54) APPARATUS AND METHOD FOR TRANSMITTING/RECEIVING SIGNAL IN A COMMUNICATION SYSTEM

(75) Inventors: Gyu-Bum Kyung, Suwon-si (KR); Seung-Hoon Choi, Suwon-si (KR); Hong-Sil Jeong, Seoul (KR); Dong-Seek Park, Yongin-si (KR); Jae-Yoel Kim, Suwon-si (KR); Sung-Eun Park, Seoul (KR); Hyun-Koo Yang, Seoul (KR); Kyeong-Cheol Yang, Seoul (KR)

(73) Assignees: Samsung Electronics Co., Ltd (KR); Postech Foundation (KR)

( * ) Notice: Subject to any disclaimer, the term of this patent is extended or adjusted under 35 U.S.C. 154(b) by 967 days.

(21) Appl. No.: 11/751,339

(22) Filed: May 21, 2007

(65) Prior Publication Data

US 2007/0283216 A1    Dec. 6, 2007

(30) Foreign Application Priority Data

May 20, 2006    (KR) .................. 10-2006-0045418

(51) Int. Cl.
*H03M 13/00*    (2006.01)
(52) U.S. Cl. ......................... 714/758; 714/752
(58) Field of Classification Search ................. 714/752, 714/758
See application file for complete search history.

(56) References Cited

U.S. PATENT DOCUMENTS

| | | | | |
|---|---|---|---|---|
| 6,933,865 B1 * | 8/2005 | Kuznetsov et al. | ............. | 341/59 |
| 2004/0005865 A1 | 1/2004 | Eroz et al. | | |
| 2005/0009475 A1 | 1/2005 | Hwang | | |
| 2005/0216821 A1 | 9/2005 | Harada | | |
| 2005/0246617 A1 | 11/2005 | Kyung et al. | | |
| 2009/0180495 A1 * | 7/2009 | Li et al. | ......................... | 370/479 |

FOREIGN PATENT DOCUMENTS

| | | |
|---|---|---|
| KR | 1020040030101 | 4/2004 |
| KR | 1020050007734 | 1/2005 |
| KR | 1020060045862 | 5/2006 |

OTHER PUBLICATIONS

Richardson et al., "Design of Capacity-Approaching Irregular Low-Density Parity-Check Codes", IEEE Transactions on Information Theory, vol. 47., No. 2, Feb. 2001.

Hossein Pishro-Nik et al., "Nonuniform Error Correction Using Low-Density Parity-Check Codes", IEEE Transactions on Information Theory, vol. 51, No. 7, Jul. 2005.

* cited by examiner

*Primary Examiner* — Sam Rizk
(74) *Attorney, Agent, or Firm* — The Farrell Law Firm, P.C.

(57) ABSTRACT

A signal transmission apparatus in a communication system is disclosed. A channel interleaver generates an interleaved vector by channel-interleaving a Low Density Parity Check (LDPC) codeword according to a channel interleaving rule, and a modulator generates a modulation symbol by modulating the interleaved vector according to a modulation scheme. The channel interleaving rule is one of a first channel interleaving rule and a second channel interleaving rule. The first channel interleaving rule is a rule for setting degree distribution for nodes in a factor graph of the LDPC codeword separately for individual levels supported by the modulation scheme. The second channel interleaving rule is a rule for allowing coded bits included in the LDPC codeword to be interleaved according to an unequal error characteristic of the modulation scheme.

40 Claims, 7 Drawing Sheets

$$H = \begin{bmatrix} 1 & 0 & 1 & 0 & 1 & 0 & 1 & 0 \\ 1 & 0 & 0 & 1 & 0 & 1 & 0 & 1 \\ 0 & 1 & 1 & 0 & 0 & 1 & 1 & 0 \\ 0 & 1 & 0 & 1 & 1 & 0 & 0 & 1 \end{bmatrix}$$

APPARATUS AND METHOD FOR TRANSMITTING/RECEIVING SIGNAL IN A COMMUNICATION SYSTEM

PRIORITY

This application claims priority under 35 U.S.C. §119(a) to a Korean Patent Application filed in the Korean Intellectual Property Office on May 20, 2006 and assigned Serial No. 2006-45418, the disclosure of which is incorporated herein by reference.

BACKGROUND OF THE INVENTION

1. Field of the Invention

The present invention relates generally to an apparatus and method for transmitting/receiving signals in a communication system, and in particular, to an apparatus and method for transmitting/receiving signals in a communication system using Low Density Parity Check (LDPC) codes.

2. Description of the Related Art

With the rapid progress of communication systems, there is an increasing demand in wireless networks for the development of a scheme capable of transmitting massive data, quantity of which approaches the capacity of wired networks. To meet the demand for the high-speed, high-capacity communication system capable of processing and transmitting a variety of information such as image and radio data beyond the early voice-oriented service, there is a need to increase transmission efficiency of the system with use of an appropriate channel coding scheme for the improvement of the system performance. However, communication systems, for example, mobile communication systems because of their characteristics, inevitably suffer errors due to noises, interferences and fading according to channel conditions during data transmission, and the occurrence of errors causes loss of data.

It is possible to improve reliability of the communication systems reducing the data loss due to the occurrence of errors by using various error control schemes according to characteristics of channels. The technique of using error correction codes is the most popular one of the error control schemes. The representative error correction codes include turbo codes and LDPC codes.

It is known that turbo codes are superior in performance gain during high-speed data transmission, compared with the convolutional codes, which have been generally used for error correction. The turbo codes can effectively correct errors due to noises generated in transmission channels, thereby contributing to an increase in reliability of data transmission. In addition, LDPC codes can be decoded using a sum-product based iterative decoding algorithm in a factor graph. A decoder for the LDPC codes, as it uses the sum-product iterative decoding algorithm, has lower complexity compared with a decoder for the turbo codes and can be simply realized with a parallel processing decoder.

Shannon's channel coding theorem shows that reliable communication is possible only at the data rate not exceeding the capacity of channels. However, in Shannon's channel coding theorem, there has been no specific presentation of a channel coding and decoding method supporting a data rate up to the maximum capacity limit of channels. Generally, random codes having a very large block size show the performance approaching the channel capacity limit of Shannon's channel coding theorem, but actual implementation thereof was impossible because use of a Maximum A Posteriori (MAP) or Maximum Likelihood (ML) decoding method causes a great load in calculation.

Turbo codes were proposed by Berrou, Glavieux and Thitimajshima in 1993, and have good performance approaching the channel capacity limit of Shannon's channel coding theorem. The proposal of turbo codes has triggered the study of iterative decoding and graphical expression of codes, and LDPC codes, which had already been proposed by Gallager in 1962 were newly lighted up at that time. In addition, there are cycles in factor graphs of the turbo code and the LDPC code, and it has already been well known that iterative decoding in the factor graph of the LDPC code, having cycles, is suboptimal. The term 'cycle' refers to a loop formed by edges connecting variable nodes to check nodes in a factor graph of an LDPC code.

It has also been experimentally proved that the LDPC codes have superior performance through iterative decoding. The LDPC codes having the best performance among the ever-known codes show performance that they have only the difference of about 0.04 [dB] at the channel capacity limit of Shannon's channel coding theorem at a Bit Error Rate (BER) of $10^{-5}$ with use of a block size of $10^7$. In addition, LDPC codes defined in Galois Field (GF) with q>2, i.e. in GF(q), increase in complexity in their decoding process, but show much better performance compared with the binary codes. However, there has been no satisfactory theoretical description for successful decoding of the LDPC codes defined in GF(q) by the iterative decoding algorithm.

In addition, the LDPC code, proposed by Gallager, is defined by a parity check matrix in which the major elements have a value of '0' (zero) and the minor elements except for the elements having a value of '0' have a non-zero value, for example, a value of '1'. For example, an (N, j, k) LDPC code, a linear block code with a block length N, is defined by a parse-structured parity check matrix including j elements with a value of '1' for each column and k elements with a value of '1' for each row, wherein all the elements except for the elements having a value of '1' have a value of '0'.

An LDPC code defined by a parity check matrix, in which the weight of each column is constant to j and the weight of each row is constant to k as described above, is referred to as a 'regular LDPC code'. The term 'weight' as used herein refers to the number of elements having a non-zero value among the elements constituting the generation matrix and parity check matrix. In contrast, an LDPC code defined by a parity check matrix, in which the weight of each column and the weight of each row are not constant, is referred to as an 'irregular LDPC code'. It is known that the irregular LDPC code is generally superior in performance to the regular LDPC code. However, as to the irregular LDPC code, the weight of each column and the weight of each row in its parity check matrix should be appropriately adjusted to guarantee its excellent performance, because the weight of each column and the weight of each row in the parity check matrix are not constant, i.e. irregular.

Figure 1:
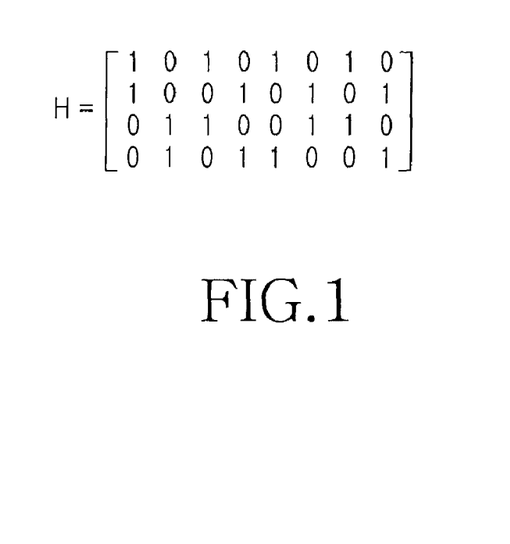
FIG. 1 is a diagram illustrating a parity check matrix of a general (8, 2, 4) LDPC code.

With reference to FIG. 1, a description will now be made of a parity check matrix of an (N, j, k) LDPC code, for example, (8, 2, 4) LDPC code.

FIG. 1 illustrates a parity check matrix of a general (8, 2, 4) LDPC code.

Referring to FIG. 1, a parity check matrix H of the (8, 2, 4) LDPC code is composed of 8 columns and 4 rows, wherein the weight of each column is regular to 2 and the weight of each row is regular to 4. Because the weight of each column and the weight of each row in the parity check matrix are regular in this way, the (8, 2, 4) LDPC code shown in FIG. 1 is a regular LDPC code.

Figure 2:
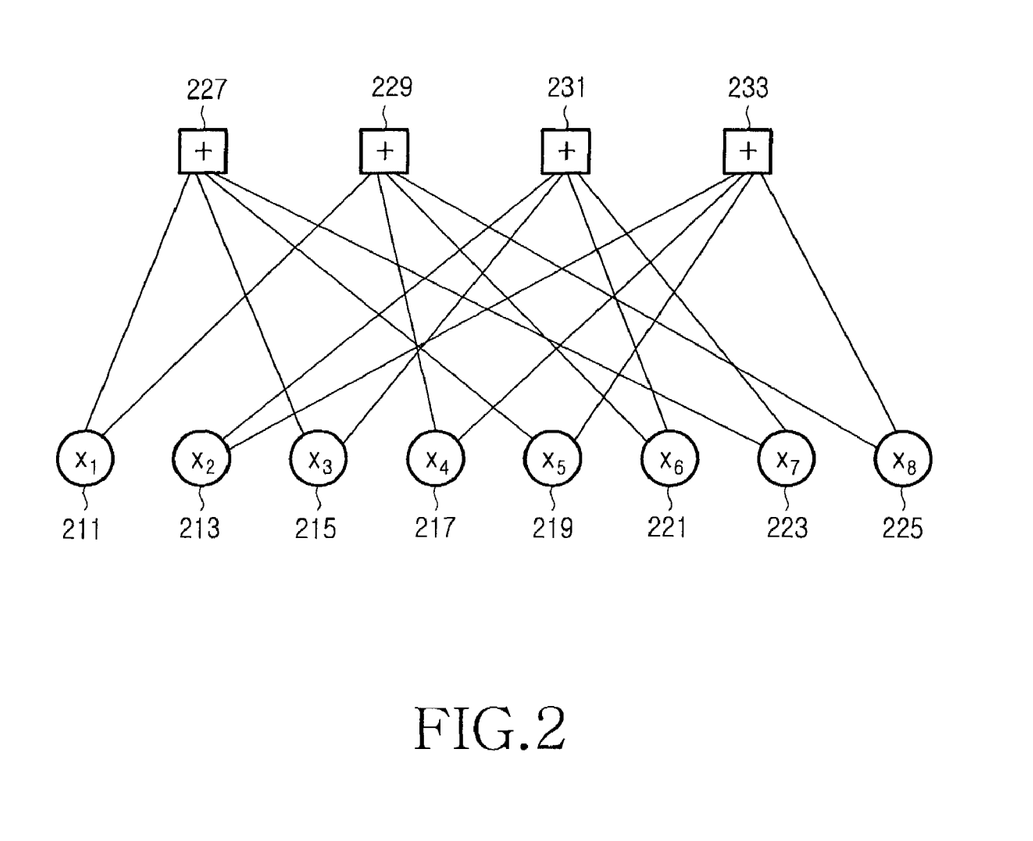
FIG. 2 is a diagram illustrating a factor graph of the (8, 2, 4) LDPC code shown in FIG. 1.

The parity check matrix of the (8, 2, 4) LDPC code has been described in FIG. 1. With reference to FIG. 2, a description will now be made of a factor graph of the (8, 2, 4) LDPC code shown in FIG. 1.

FIG. 2 illustrates a factor graph of the (8, 2, 4) LDPC code shown in FIG. 1.

Referring to FIG. 2, the factor graph of the (8, 2, 4) LDPC code includes 8 variable nodes $x_1$ designated as 211, $x_2$ as 213, $x_3$ as 215, $x_4$ as 217, $x_5$ as 219, $x_6$ as 221, $x_7$ as 223 and $x_8$ as 225, and 4 check nodes 227, 229, 231 and 233. If an element having a value of '1', i.e. a non-zero value, exists in the point where an $i^{th}$ row and a $j^{th}$ column of a parity check matrix of the (8, 2, 4) LDPC code intersect with each other, a branch is generated between a variable node $x_i$ and a $j^{th}$ check node.

Because the parity check matrix of the LDPC code has a very low weight as described above, decoding is possible through iterative decoding even in the block code having a relatively long length, and if the block length of the block code continues to increase, the block code shows the performance approaching the Shannon's channel capacity limit, like the turbo code. In addition, MacKay and Neal have already proved that the iterative decoding process of the LDPC code using a flow transfer scheme shows performance approaching the performance of the iterative decoding process of the turbo code.

To generate a high-performance LDPC code, the following several conditions should be satisfied.

(1) A cycle in a factor graph of an LDPC code should be considered.

The length of the cycle is defined as the number of edges constituting the loop. A long length of the cycle indicates that there are a large number of edges connecting variable nodes to check nodes, the edges constituting the loop in the factor graph of the LDPC code. On the contrary, a short length of the cycle indicates that there are a small number of edges connecting variable nodes to check nodes, the edges constituting the loop in the factor graph of the LDPC code.

An increase in length of the cycle in the factor graph of the LDPC code increases performance of the LDPC code for the following reasons. The increase in length of the cycle in the factor graph of the LDPC code prevents performance degradation such as an error floor, which may occur when there are many short-length cycles in the factor graph of the LDPC code.

(2) Efficient coding of the LDPC code should be considered.

Real-time coding is difficult with the LDPC code due to the high coding complexity, compared with the convolutional code or the turbo code. Although a Repeat Accumulate (RA) code has been proposed to reduce the coding complexity of the LDPC code, the RA code also shows a limit in reducing the coding complexity of the LDPC code. Therefore, efficient coding of the LDPC code should be considered.

(3) Degree distribution in a factor graph of an LDPC code should be considered.

Generally, an irregular LDPC code is superior in performance to a regular LDPC code, because the factor graph of the irregular LDPC code has various degrees. The term 'degree' as used herein refers to the number of edges connected to nodes, i.e. variable nodes and check nodes, in the factor graph of the LDPC code. In addition, 'degree distribution in the factor graph of the LDPC code' refers to a ratio of the number of nodes having a specific degree to the total number of nodes. Richardson et al. has already proven that an LDPC code having a specific degree distribution shows excellent performance.

Even though the current communication system considers using the LDPC codes, channel interleaving/deinterleaving scheme in the communication system using the LDPC code has never been proposed as a signal transmission/reception scheme. Accordingly, there is a need for a scheme of transmitting/receiving signals in the communication system using LDPC codes.

SUMMARY OF THE INVENTION

An aspect of the present invention is to address at least the above problems and/or disadvantages and to provide at least the advantages described below. Accordingly, an aspect of the present invention is to provide an apparatus and method for transmitting/receiving signals in a communication system using LDPC codes.

Another aspect of the present invention is to provide an apparatus and method for transmitting/receiving signals using a channel interleaving/deinterleaving scheme in a communication system using LDPC codes.

According to one aspect of the present invention, there is provided a signal transmission apparatus in a communication system. The signal transmission apparatus includes a channel interleaver for generating an interleaved vector by channel-interleaving a Low Density Parity Check (LDPC) codeword according to a channel interleaving rule; and a modulator for generating a modulation symbol by modulating the interleaved vector according to a modulation scheme. The channel interleaving rule is one of a first channel interleaving rule and a second channel interleaving rule. The first channel interleaving rule is a rule for setting degree distribution for nodes in a factor graph of the LDPC codeword separately for individual levels supported by the modulation scheme. The second channel interleaving rule is a rule for allowing coded bits included in the LDPC codeword to be interleaved according to an unequal error characteristic of the modulation scheme.

According to another aspect of the present invention, there is provided a signal reception apparatus in a communication system. The signal reception apparatus includes a demodulator for generating a demodulation vector by demodulating a reception vector using a demodulation scheme corresponding to a modulation scheme used in a signal transmission apparatus; and a channel deinterleaver for generating a deinterleaved vector by channel-deinterleaving the demodulation vector using a channel deinterleaving scheme corresponding to a channel interleaving rule used in the signal transmission apparatus. The channel interleaving rule is one of a first channel interleaving rule and a second channel interleaving rule. The first channel interleaving rule is a rule for setting degree distribution for nodes in a factor graph of a Low Density Parity Check (LDPC) codeword separately for individual levels supported by the modulation scheme. The second channel interleaving rule is a rule for allowing coded bits included in the LDPC codeword to be interleaved according to an unequal error characteristic of the modulation scheme.

According to a further aspect of the present invention, there is provided a method for transmitting a signal by a signal transmission apparatus in a communication system. The method includes generating an interleaved vector by channel-interleaving a Low Density Parity Check (LDPC) codeword according to a channel interleaving rule; and generating a modulation symbol by modulating the interleaved vector according to a modulation scheme. The channel interleaving rule is one of a first channel interleaving rule and a second channel interleaving rule. The first channel interleaving rule is a rule for setting degree distribution for nodes in a factor graph of the LDPC codeword separately for individual levels supported by the modulation scheme. The second channel interleaving rule is a rule for allowing coded bits included in the LDPC codeword to be interleaved according to an unequal error characteristic of the modulation scheme.

According to yet another aspect of the present invention, there is provided a method for receiving a signal by a signal reception apparatus in a communication system. The method includes generating a demodulation vector by demodulating a reception vector using a demodulation scheme corresponding to a modulation scheme used in a signal transmission apparatus; and generating a deinterleaved vector by channel-deinterleaving the demodulation vector using a channel deinterleaving scheme corresponding to a channel interleaving rule used in the signal transmission apparatus. The channel interleaving rule is one of a first channel interleaving rule and a second channel interleaving rule. The first channel interleaving rule is a rule for setting degree distribution for nodes in a factor graph of a Low Density Parity Check (LDPC) codeword separately for individual levels supported by the modulation scheme. The second channel interleaving rule is a rule for allowing coded bits included in the LDPC codeword to be interleaved according to an unequal error characteristic of the modulation scheme.

BRIEF DESCRIPTION OF THE DRAWINGS

The above and other aspects, features and advantages of the present invention will become more apparent from the following detailed description when taken in conjunction with the accompanying drawings in which.

DETAILED DESCRIPTION OF PREFERRED EMBODIMENTS

Preferred embodiments of the present invention will now be described in detail with reference to the annexed drawings. In the following description, a detailed description of known functions and configurations incorporated herein has been omitted for clarity and conciseness.

The present invention provides an apparatus and method for transmitting/receiving signals in a communication system using Low Density Parity Check (LDPC) codes. In addition, the present invention provides an apparatus and method for transmitting/receiving signals using a channel interleaving/deinterleaving scheme in a communication system using LDPC codes.

Figure 3:
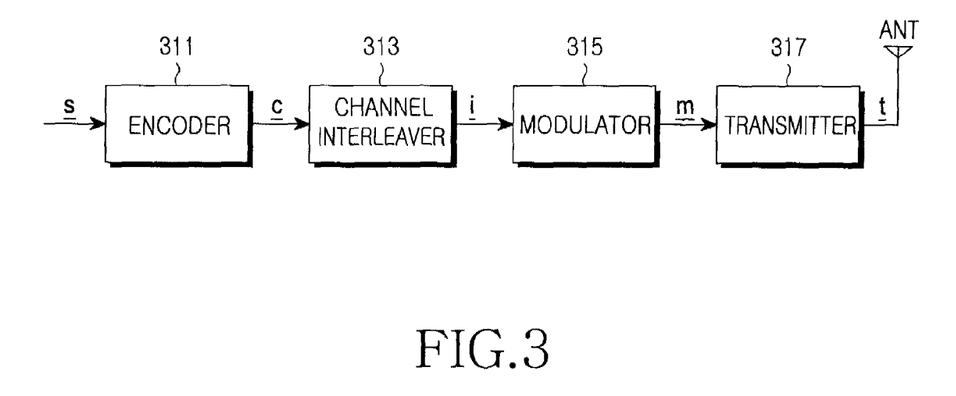
FIG. 3 is a block diagram illustrating the structure of a signal transmission apparatus in a communication system using LDPC codes according to an embodiment of the present invention.

Referring to FIG. 3, the signal transmission apparatus includes an encoder 311, a channel interleaver 313, a modulator 315, and a transmitter 317. If an information vector s that the signal transmission apparatus desires to transmit is generated, the information vector s is delivered to encoder 311. Encoder 311 generates a codeword vector c, i.e. LDPC codeword, by encoding the information vector s using a predetermined coding scheme, and outputting the codeword vector c to channel interleaver 313. The coding scheme is an LDPC coding scheme. Channel interleaver 313 generates an interleaved vector i by interleaving the codeword vector c using a predetermined channel interleaving scheme, and outputs the interleaved vector i to modulator 315. Herein, channel interleaver 313 performs channel interleaving such that when modulator 315 modulates the interleaved vector i using a modulation scheme, the interleaved vector i can be allocated to modulation symbols so as to minimize an error rate. That is, channel interleaver 313 is designed using the characteristic that respective bits of an LDPC codeword have different reliability according to the cycle characteristic of the LDPC codeword, the weight distribution, and the degree (or order) of variable nodes corresponding to codeword bits. The channel interleaving operation of channel interleaver 313 is performed according to 'Degree Profile Matching (DPM) channel interleaver design rule' proposed in the present invention, a detailed description of which will be made herein below.

Modulator 315 generates a modulation vector m by modulating the interleaved vector i using a predetermined modulation scheme, and outputs the modulation vector m to transmitter 317. Transmitter 317 generates a transmission vector t by performing transmission signal processing on the modulation vector m, and transmits the transmission vector t to a signal reception apparatus via an antenna.

Figure 4:
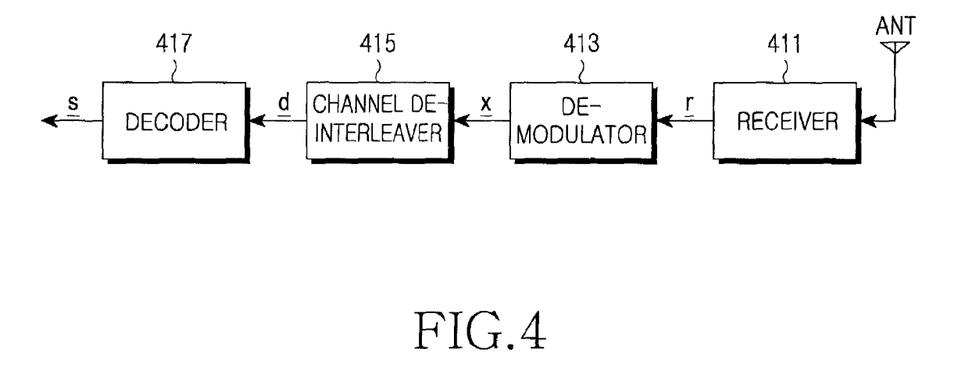
FIG. 4 is a block diagram illustrating the structure of a signal reception apparatus in a communication system using LDPC codes according to an embodiment of the present invention.

With reference to FIG. 4, a description will now be made of a structure of a signal reception apparatus in a communication system using LDPC codes according to an embodiment of the present invention.

Referring to FIG. 4, the signal reception apparatus includes a receiver 411, a demodulator 413, a channel deinterleaver 415, and a decoder 417. A signal transmitted by a signal transmission apparatus is received at the signal reception apparatus via an antenna, and the signal received via the antenna is delivered to receiver 411. Receiver 411 performs reception signal processing on the received signal, and outputs the processed reception vector r to demodulator 413. Demodulator 413 demodulates the reception vector r output from receiver 411 using a demodulation scheme corresponding to the modulation scheme used in modulator 315 of the signal transmission apparatus, and outputs the resulting demodulation vector x to channel deinterleaver 415. Channel deinterleaver 415 generates a deinterleaved vector d by performing channel deinterleaving on the demodulation vector x using a channel deinterleaving scheme corresponding to the channel interleaving scheme used in channel interleaver 313 of the signal transmission apparatus, and outputs the deinterleaved vector d to decoder 417. A channel deinterleaving operation of channel deinterleaver 415 is also performed according to a 'Digital Phase Modulation (DPM) channel interleaver design rule' proposed in the present invention, a detailed description of which will be made herein below.

Decoder 417 generates a restored information vector ŝ by decoding the deinterleaved vector d using a decoding scheme corresponding to the coding scheme used in encoder 311 of the signal transmission apparatus. The decoding scheme, i.e. LDPC decoding scheme, is a scheme of using a sum-product based iterative decoding algorithm.

Figure 5:
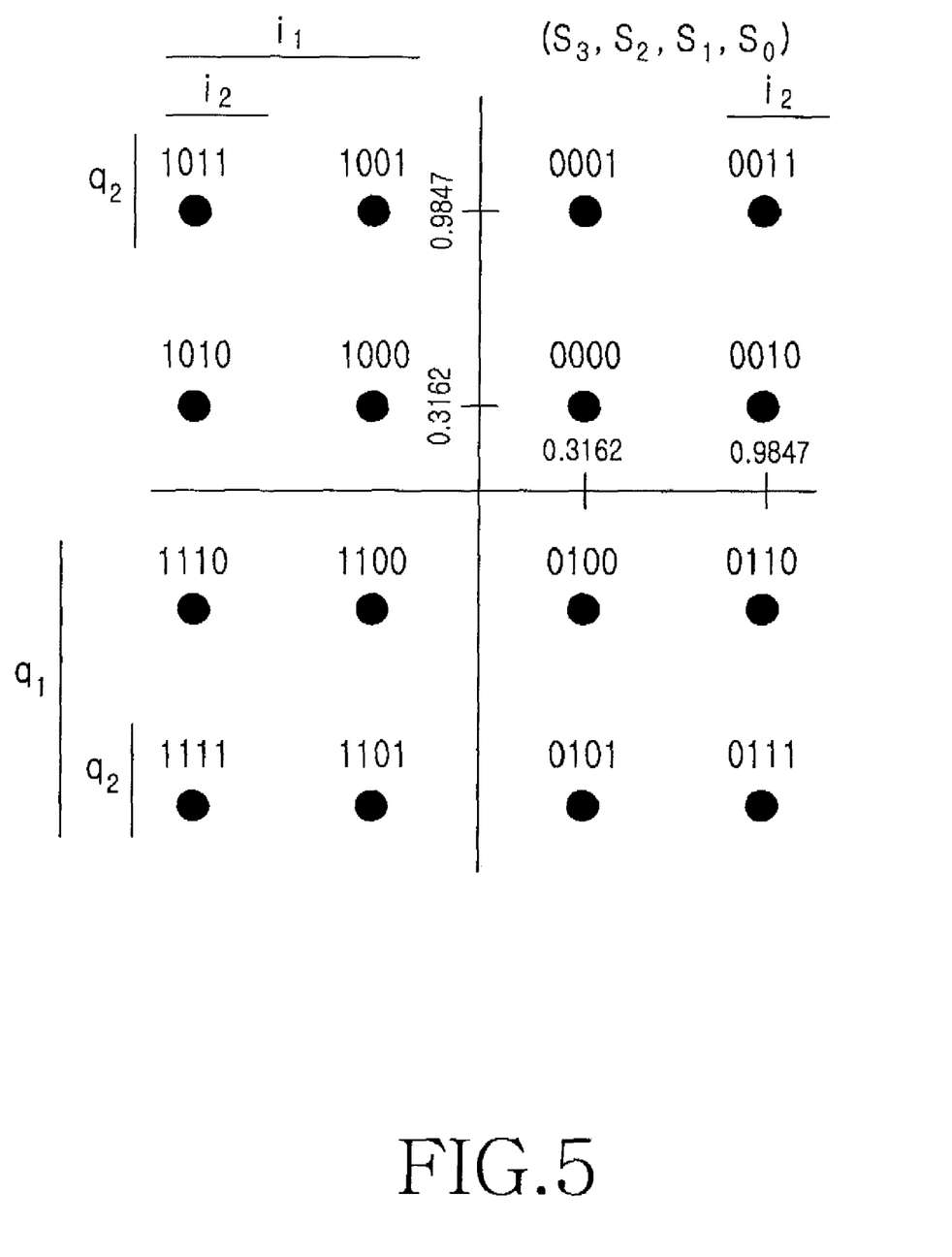
FIG. 5 is a diagram schematically illustrating a modulation constellation of a general 16QAM modulation scheme.

With reference to FIG. 5, a description will now be made of a modulation constellation for application of 16-ary Quadrature Amplitude Modulation (16 QAM) which is a modulation scheme generally used in the communication system.

As illustrated in FIG. 5, bits $s_3$, $s_2$, $s_1$, and $s_0$ corresponding to one modulation symbol are different in reliability. In FIG. 5, $i_1$ and $i_2$ having a real value are mapped to $S_3$ and $S_1$ in the modulation symbol. The bit $S_3$ is mapped so as to have values of '0' and '1' in symmetry with the y axis which is an imaginary axis, but the bit $S_1$ is mapped so as to have a value of '0' in a region near to the y axis and a value of '1' in a region far from the y axis, so the probability that a receiver will decide '0' as '1' is higher than the probability that the receiver will decide '1' as '0'. Due to this asymmetry, the probability that the values mapped to the bit $S_1$ will experience error increases, causing a reduction in reliability. In FIG. 5, $q_1$ and $q_2$ having an imaginary value are mapped to $S_2$ and $S_0$ in the modulation symbol. Because $S_2$ and $S_0$ are similar to $S_3$ and $S_1$, bit $S_2$ is higher in reliability than bit $S_0$.

Figure 6:
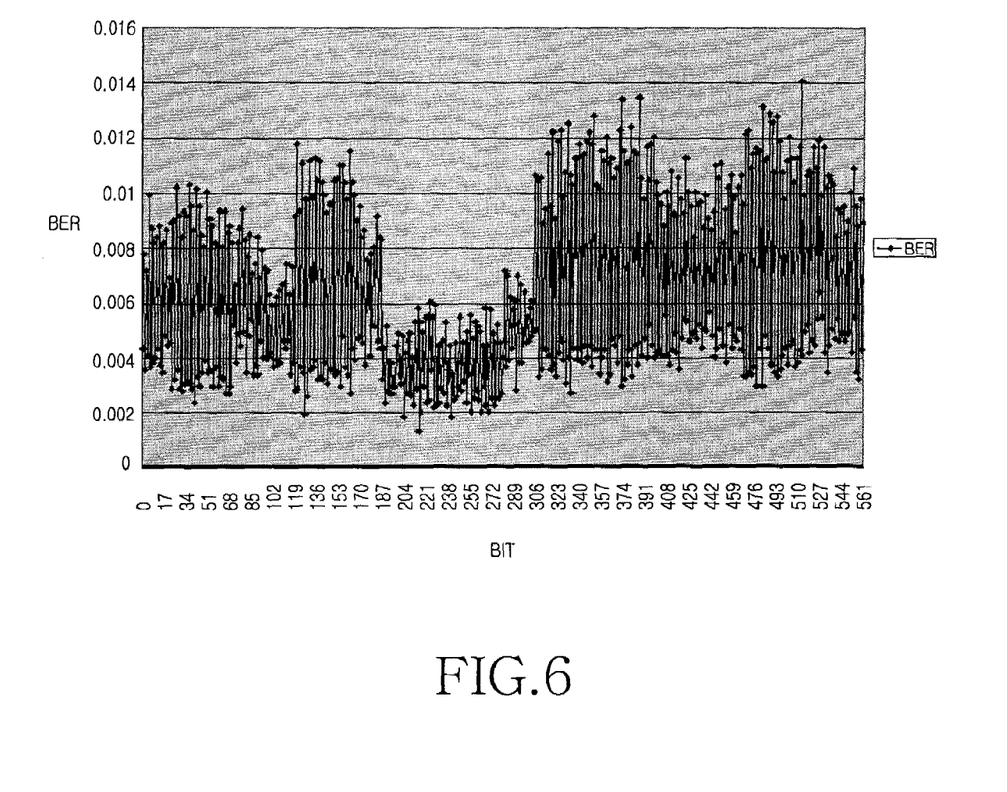
FIG. 6 is a graph of a BER per bit for an LDPC code with a codeword length of 576 and a coding rate of ½.

An embodiment of the present invention designs a Digital Phase Modulation (DPM) channel interleaver using unequal error characteristics of the high-order modulation scheme described above. With reference to FIG. 6, a description will now be made of a Bit Error Rate (BER) per bit of an LDPC code with a codeword length of 576 and a coding rate of ½.

Referring to FIG. 6, the x axis indicates $1^{st}$ to $576^{th}$ bits, which are mapped to $1^{st}$ to $576^{th}$ columns of a parity check matrix, respectively. The y axis indicates a BER for each of the $1^{st}$ to $576^{th}$ bits.

For the LDPC code with codeword length=576 and coding rate=½, $1^{st}$ to $192^{nd}$ bits correspond to a degree-3 variable node, $193^{rd}$ to $288^{th}$ bits correspond to a degree-6 variable node, and the remaining bits correspond to a degree-2 or 3 variable node. Herein, the degree of the variable node corresponds to a weight of the corresponding column, and the 'weight' refers to the number of elements having a non-zero value among the elements constituting a generation matrix and a parity check matrix of the LDPC code.

It can be noted from FIG. 6 that $1^{st}$ to $192^{nd}$ bits and $289^{th}$ to $576^{th}$ bits corresponding to the low-degree variable node are higher in BER than $193^{rd}$ to $288^{th}$ bits corresponding to the high-degree variable node. It can also be noted from FIG. 6 that even the bits corresponding to the variable nodes having the same degree are different in BER because cycles connected to the nodes are different in structure, i.e. size and number of cycles.

The LDPC code can be decoded using a sum-product based iterative decoding algorithm in a factor graph. However, because reliability of each coded bit is affected by the cycle structure because of characteristics of the sum-product algorithm, many bits, which are generally connected to the short-length cycle decrease in their reliability. Therefore, an average cycle value is used as an index for measuring the reliability, and the average cycle value can be calculated by summing up sizes of all cycles connected to a variable node in a factor graph, which correspond to the coded bits, and dividing the sum by the number of the cycles. As a result, the coded bits corresponding to the variable node with a short average cycle are low in reliability, and the coded bits corresponding to the variable node with a long average cycle are high in reliability.

In addition, reliability of the LDPC code is affected even by the number of check nodes connected to a variable node in a factor graph, i.e. a degree of the variable node, and the coded bits corresponding to the high-degree variable node are high in reliability.

Therefore, the present invention designs a DPM channel interleaver of the LDPC code taking into account the cycle size and node degree characteristics, and its design rule is as follows. The 'DPM channel interleaver' refers to a channel interleaver using the DPM channel interleaving scheme.

DPM Channel Interleaver Design Rule

An LDPC code ensemble $C(\lambda,\rho)$ indicates the set of all LDPC codes having a factor graph satisfying the degree distribution $(\lambda,\rho)$ defined in Equation (1).

$$\lambda(x) = \sum_{i=2}^{d_v} \lambda_i x^{i-1}, \qquad (1)$$

$$\rho(x) = \sum_{i=2}^{d_c} \rho_i x^{i-1}$$

In Equation (1), $\lambda_i$ and $\rho_i$ denote ratios of edges connected to variable nodes and check nodes having a degree i, $\lambda(x)$ denotes degree information of columns of a parity check matrix, and $\rho(x)$ denotes degree information of rows of the parity check matrix. As a result, Equation (1) is a degree distribution polynomial.

A description will now be made of a structure of a signal transmission apparatus for a communication system assuming that the modulator 315 of FIG. 3 uses a $2^m$-Phase Amplitude Modulation (PAM) as a modulation scheme.

Each N-tuple binary codeword of the LDPC code belonging to $C(\lambda,\rho)$ is interleaved bit by bit, and is divided into m subsets, where N denotes a multiple of m, and m denotes the number of levels supported by the corresponding modulation scheme. The term 'level' as used herein refers to a gather of coded bits having the same error rate among all the coded bits that have different error rates during demodulation of an m-bit modulated symbol. In other words, the level can be regarded as a subset obtained by gathering first bits in the m-bit modulation symbols, and a subset obtained by gathering second bits in the m-bit modulation symbols. In addition, for j=1, . . . , m, $C^{(j)}$ will be defined as a subset of coded bits belonging to a $j^{th}$ level, and 'a' will be defined as address vectors $a_1, \ldots, a_m$ of elements belonging to $C^{(j)}$. For example, when the modulation scheme is Binary Phase Shift Keying (BPSK), a level supported by BPSK is j=1; when the modulation scheme is 4-ary PAM (4-PAM) or 16 QAM, a level supported by 4-PAM or 16 QAM is j=2; and when the modulation scheme is 8-PAM or 64 QAM, a level supported by 8-PAM or 64 QAM is j=3.

Modulator 315 then maps the 'a' to signal points in the signal constellation. In these points, all channels of the communication system can be divided into m equivalent binary input channels, and coded bits belonging to $C^{(j)}$ are transmitted over the equivalent binary input channels belonging to a $j^{th}$ level. Herein, the m equivalent binary input channels can be arranged in descending order according to their reliabilities. In particular, the coded bits belonging to $C^{(1)}$ are allocated as Most Significant Bit (MSB) bits of modulation symbols, and the coded bits belonging to $C^{(m)}$ are allocated as Least Significant Bit (LSB) bits of modulation symbols.

In addition, $V^{(j)}$ will be defined as a subset of variable nodes corresponding to coded bits belonging to $C^{(j)}$, and $\lambda^{(j)}$ will be defined as degree distribution for variable nodes belonging to $V^{(j)}$. If degree distribution of $C^{(j)}$ for an arbitrary j remains unchanged after channel interleaving, a channel interleaver performing the foregoing channel interleaving is a DPM channel interleaver having degree information $\Lambda=(\lambda^{(1)}, \ldots, \lambda^{(m)})$.

Figure 7:
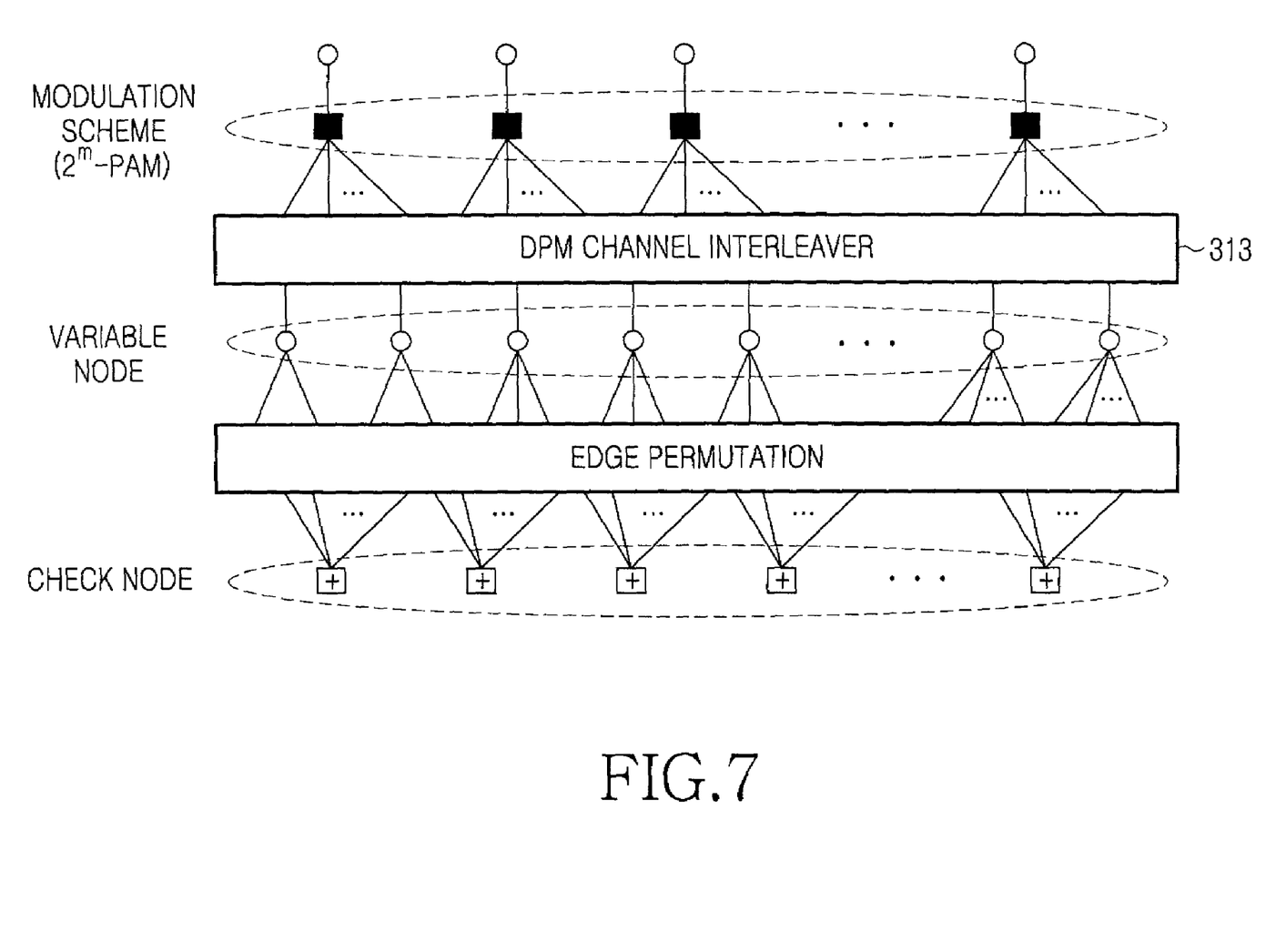
FIG. 7 is a diagram illustrating a factor graph of an interleaved vector i for the case where the channel interleaver of FIG. 3 is a DPM channel interleaver and the modulator uses $2^m$-PAM as a modulation scheme.

With reference to FIG. 7, a description will now be made of a factor graph of an interleaved vector i output from channel interleaver 313 for the case where channel interleaver 313 of FIG. 3 is a DPM channel interleaver and modulator 315 uses $2^m$-PAM as a modulation scheme.

Referring to FIG. 7, because channel interleaver 313 is a DPM channel interleaver, performance of the communication system shown in FIG. 3 is considerably affected by degree information $\Lambda$ of the DPM channel interleaver. That is, for given degree distribution $(\lambda,\rho)$ and modulation degree (or modulation degree), degree information $\Lambda$ of the DPM channel interleaver is optimized using a density evolution scheme. Generally, the optimized density evolution of the LDPC code is generally affected by channel and modulation, and this indicates that the LDPC code can have degree distribution capable of acquiring the best performance for each modulation order. Therefore, the present invention provides a DPM channel interleaver optimized for each modulation order.

All messages of edges in a factor graph corresponding to each iteration of density evolution for $C(\lambda,\rho)$ will be assumed to have the same Probability Density Function (PDF). However, for $2^m$-PAM, a message from each of the equivalent binary input channels can have different probability density functions, and the probability density functions are greatly different from Gaussian distribution. Therefore, when optimizing the degree information $\Lambda$, the present invention groups variable nodes corresponding to points of address vectors $a_1, \ldots, a_m$ to make the best use of the characteristic of each input channel.

A description will now be made of a factor graph of an LDPC code having a degree distribution $(\lambda,\rho)$, a set E of edges, and a set V of variable nodes. $E^{(j)}$ will be assumed herein to be a set of edges connected to variable nodes belonging to $V^{(j)}$. In this case, the degree distribution $\lambda^{(j)}$ for variable nodes can be expressed as Equation (2).

$$\lambda^{(j)}(x) = \sum_{i=2}^{d_v} \lambda_i^{(j)} x^{i-1} \quad (2)$$

In Equation (2), $\lambda_i^{(j)}$ denotes a ratio of edges in the set E, connected to a degree-i variable node belonging to $V^{(j)}$. In addition, $$\lambda^{(j)} = \frac{|E^{(j)}|}{|E|},$$

where $|E|$ denotes the number of elements belonging to the set E. That is, as shown in Equation (2), the DPM channel interleaver indicates a channel interleaver designed to set a degree distribution of the LDPC code separately for individual levels supported in the modulation scheme. The reason for setting the degree distribution of the LDPC code separately for individual levels supported in the modulation scheme in this manner is to perform channel interleaving on an LDPC codeword taking into account the unequal error characteristic of the modulation scheme (especially of a high-order modulation scheme).

If it is assumed herein that only one LDPC code is used, the degree information $\Lambda$ has the following two characteristics.

According to a first characteristic, $C^{(j)}$ should include the same number of elements. Because $C^{(j)}$ includes the same number of elements, the relationship expressed by Equation (3) is satisfied.

$$\sum_{i=2}^{d_v} \lambda_i^{(1)} = \sum_{i=2}^{d_v} \lambda_i^{(2)} = \ldots = \sum_{i=2}^{d_v} \lambda_i^{(m)} \quad (3)$$

According to a second characteristic, the entire degree distribution of an LDPC code after channel interleaving should be equal to the entire degree distribution of an LDPC code before channel interleaving. That is, for all i, the relationship of Equation (4) should be satisfied.

$$\sum_{j=1}^{m} \lambda_i^{(j)} = \lambda_i \quad (4)$$

As a result, for an LDPC code ensemble $C^m(\lambda,\rho;\Lambda)$, its associated factor graph indicates a set of all LDPC codes having degree distribution $(\lambda,\rho)$, and its DPM channel interleaver has degree information $\Lambda$ satisfying conditions of Equation (3) and Equation (4). That is, the LDPC code ensemble $C^m(\lambda,\rho;\Lambda)$ can be regarded as an example of an LDPC code ensemble $C(\Lambda,\rho)$ for a non-constant channel.

A description will now be made of density evolution for optimizing degree information $\Lambda$ for the LDPC code ensemble $C^m(\lambda,\rho;\Lambda)$.

Assume that $P_l$ indicates density of a message delivered from a variable node to a check node at $l^{th}$ iteration. Therefore, density of an initial message from equivalent binary input channels belonging to a $j^{th}$ level is expressed as $P_O^{(j)}$. In addition, assume that $Q_l$ indicates a message delivered from a check node to a variable node at $l^{th}$ iteration. In this case, the update rule for density evolution can be expressed as Equation (5).

$$P_l = \sum_{j=1}^{m} P_O^{(j)} \otimes \lambda^{(j)}(Q_l), \quad (5)$$

$$Q_l = \Gamma^{-1}(\rho(\Gamma(P_{l-1})))$$

In Equation (5), $\otimes$ denotes convolution, and $\Gamma$ and $\Gamma^{-1}$ are operations defined by T. J. Richardson, A. Shokrollahi, and R. Urbanke in February 2001 in "Design of capacity-approaching low-density parity-check codes" disclosed in Institute of Electrical and Electronics Engineers (IEEE) Trans. Inform. Theory, vol. 47, pp. 619-637.

In addition, the noise threshold of the LDPC code ensemble $C^m(\lambda,\rho;\Lambda)$ is determined by Equation (5). That is, the LDPC code ensemble $C^m(\lambda,\rho;\Lambda)$ corresponds to a code ensemble of an LDPC code that uses given degree distribution $(\lambda,\rho)$ and DPM channel interleaver, and as a result, its factor graph has degree information $\Lambda$ for $2^m$-PAM. Therefore, a degree profile for the DPM channel interleaver can be optimized using the same scheme as the scheme used for optimizing an irregular LDPC code.

Meanwhile, the LDPC code ensemble $C(\lambda,\rho)$ defined by H. Pishro-Nik, N. Rahnavard, and F. Fekri in July 2005 in "Non-uniform error correction using low-density parity-check coded" disclosed in IEEE Trans. Inform. Theory, vol. 51, pp. 2702-2714, is used for optimizing an LDPC code for a given modulation scheme.

Conventionally, the communication system should use multiple LDPC codes in order to support the different number of modulation orders. That is, conventionally, when the communication system uses BPSK, 16 QAM and 64 QAM as modulation schemes, the communication system should use the LDPC codes designed to be optimized for use of each of BPSK, 16 QAM and 64 QAM. As a result, the communication system should constantly store the parity check matrixes to be optimized for use of each of BPSK, 16 QAM and 64 QAM, reducing the memory efficiency, and should also change the LDPC code instantaneously used according to the modulation scheme used therein, increasing the complexity.

However, the present invention, as it uses the DPM channel interleaver, can support different multiple modulation orders with use of only one LDPC code. That is, even with the use of the LDPC code optimized targeting use of an arbitrary one modulation order, for example, BPSK, the present invention can support not only BPSK but also different modulation orders like 16 QAM and 64 QAM through channel interleaving. Therefore, even though the modulation order used in the communication system is different from the optimal modulation order of the designed LDPC code, the present invention can maintain good performance. As a result, the present invention can maintain performance of the LDPC code through channel interleaving no matter which modulation scheme the communication system uses.

In addition, the scheme of optimizing degree information $\Lambda$ from a given degree distribution $(\lambda,\rho)$ is more simple compared with the method of optimizing degree information $\Lambda$ from the LDPC code ensemble $C(\lambda,\rho)$. For Gray-mapped 4-PAM and 8-PAM, a degree profile for a DPM channel interleaver can be optimized by applying differential evolution, as shown in Table 1.

TABLE 1

| i | BPSK $\lambda_i$ | 4-PAM $\lambda_i^{(1)}$ | 4-PAM $\lambda_i^{(2)}$ | 8-PAM $\lambda_i$ | 8-PAM $\lambda_i^{(1)}$ | 8-PAM $\lambda_i^{(2)}$ |
|---|---|---|---|---|---|---|
| 2 | 0.23802 | 0.14145 | 0.09657 | 0.06940 | 0.06879 | 0.09983 |
| 3 | 0.20997 | 0.03358 | 0.17639 | 0.08188 | 0.10003 | 0.02806 |
| 4 | 0.03492 | 0.02744 | 0.00748 | 0.01586 | 0.00283 | 0.01623 |
| 5 | 0.12015 | 0.11547 | 0.00468 | 0.00280 | 0.06817 | 0.04918 |
| 7 | 0.01587 | 0.01585 | 0.00002 | 0.01012 | 0.00189 | 0.00386 |
| 14 | 0.00480 | 0.00304 | 0.00176 | 0.00238 | 0.00092 | 0.00150 |
| 15 | 0.37627 | 0.15561 | 0.22066 | 0.22523 | 0.01104 | 0.14000 |

The degree profile for the DPM channel interleaver shown in Table 1 is for the case where the maximum variable node degree is 15, and noise thresholds of degree profiles for the DPM channel interleavers optimized for 4-PAM and 8-PAM, are 2.52 [dB] and 4.88 [dB], respectively. In addition, the noise threshold of the degree profile for the DPM channel interleaver optimized for 4-PAM is equal to the noise threshold of the LDPC code optimized using a Gaussian approach.

Figure 8:
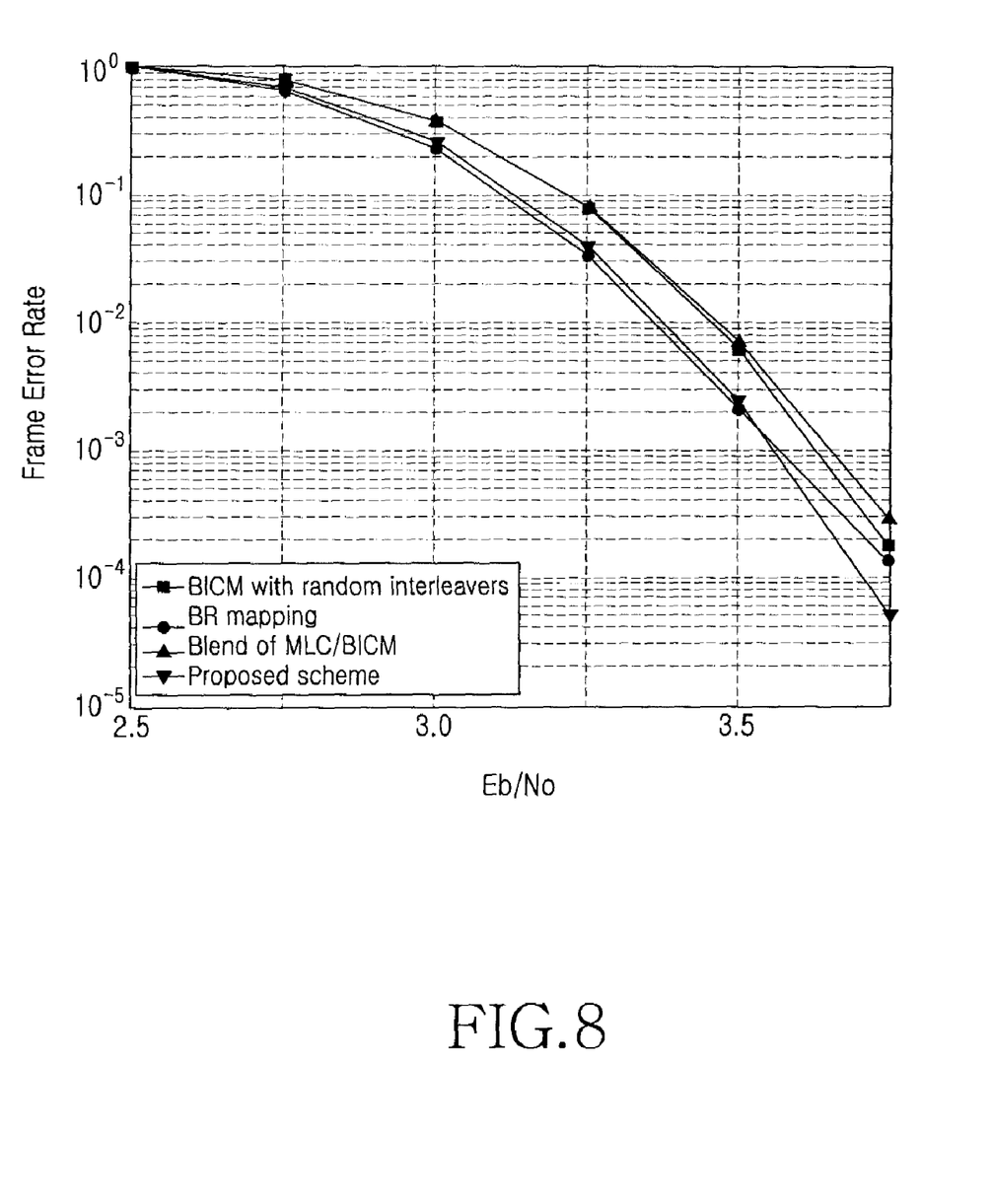
FIG. 8 is a graph illustrating performance comparison between the proposed communication system using 4-PAM as a modulation scheme and other communication systems.

With reference to FIG. 8, a description will now be made of performance comparison between the proposed communication system using 4-PAM as a modulation scheme and other communication systems.

Shown in FIG. 8 is a performance graph for an LDPC code with a coding rate=½ and a length=4032. In FIG. 8, the curve with squares indicates performance when a random interleaver is used as the channel interleaver; the curve with circles indicates performance when Bit Reliability (BR) mapping is used; the curve with triangles indicates performance when a combined scheme (MLC/BICM scheme) of a Multi-Level Coding (MLC) scheme and a Bit Interleaved Coded Modulation (BICM) scheme is used; and the curve with reverse triangles indicates performance when the proposed scheme is used. The operation performed when the BR mapping is used is disclosed in 'Bit-reliability mapping in LDPC-coded modulation systems' proposed by Y. Li and W. E. Ryan in IEEE Commun. Letters, vol. 9, pp. 1-3, January 2005, and the operation performed when MLC/BICM is used is disclosed in 'Design of low-density parity-check codes for high order constellations' proposed by H. Sankar, N. Sindhushayana and K. R. Narayanan in Globecom '04, pp. 3113-3117, Decemeber 2004. The BR mapping scheme and the MLC/BICM scheme are not directly related to the present invention, so a detailed description thereof will be omitted herein.

Figure 9:
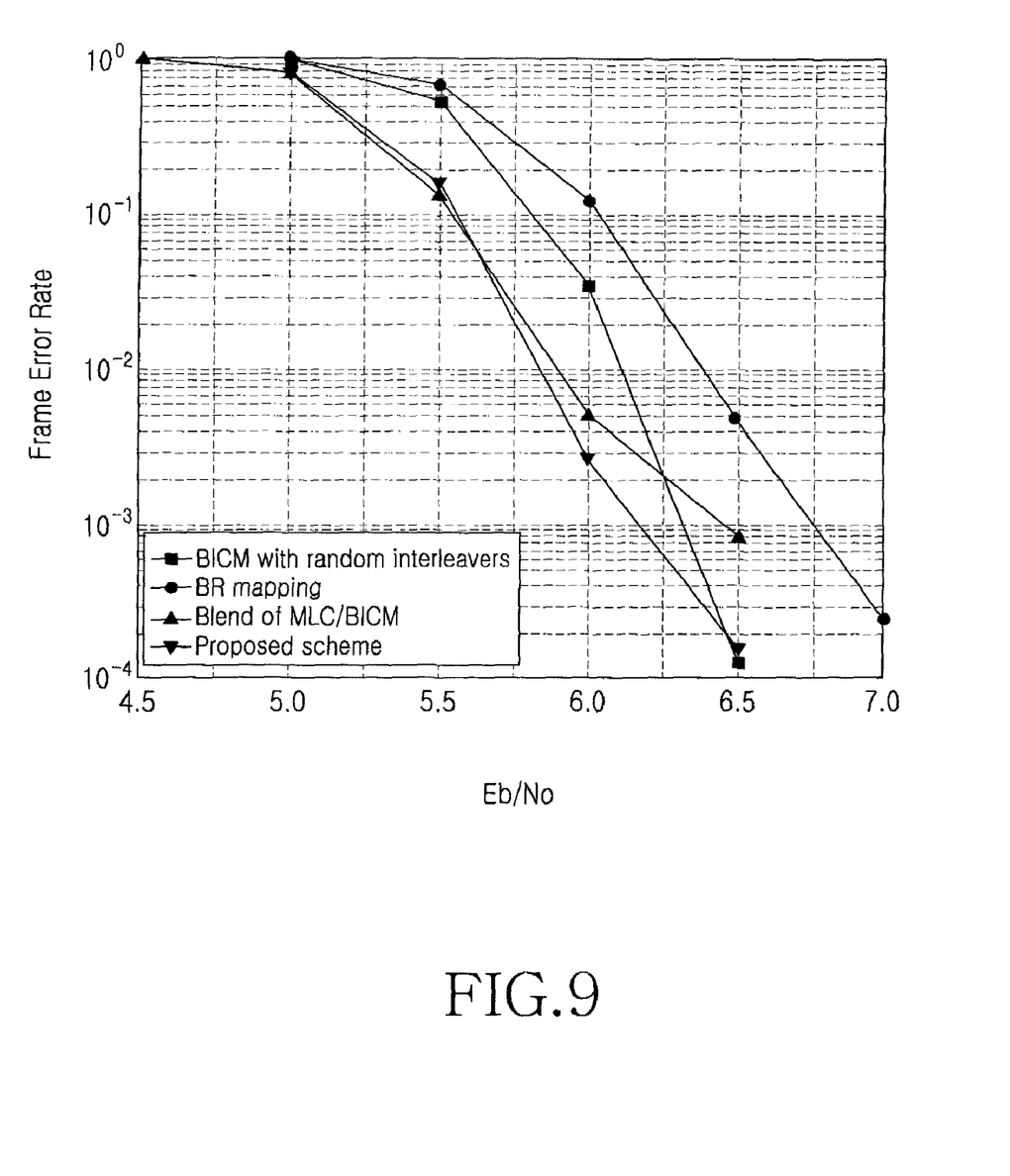
FIG. 9 is a graph illustrating performance comparison between the proposed communication system using 8-PAM as a modulation scheme and other communication systems.

With reference to FIG. 9, a description will now be made of performance comparison between the proposed communication system using 8-PAM as a modulation scheme and other communication systems.

Shown in FIG. 9 is a performance graph for an LDPC code with a coding rate=½ and a length=4032. In FIG. 9, the curve with squares indicates performance when a random interleaver is used as the channel interleaver; the curve with circles indicates performance when BR mapping is used; the curve with triangles indicates performance when the MLC/BICM scheme is used; and the curve with reverse triangles indicates performance when the proposed scheme is used.

It can be noted from FIGS. 8 and 9 that the proposed communication system is much superior in performance to other communication systems.

As is apparent from the foregoing description, the present invention controls the communication system using LDPC codes to perform channel interleaving taking the unequal reliability characteristics into account, thereby improving reliability of the LDPC codes. In particular, the present invention increases reliabilities of low-reliability bits among the bits constituting the LDPC code, through channel interleaving. The transmission/reception of the reliable LDPC codes decreases the error rate of the entire system, enabling high-speed reliable communication. In addition, the present invention can support different multiple modulation orders with only one LDPC code through DPM channel interleaving, thereby contributing to an increase in memory efficiency and a decrease in complexity.

While the invention has been shown and described with reference to a certain preferred embodiment thereof, it will be understood by those skilled in the art that various changes in form and details may be made therein without departing from the spirit and scope of the invention as further defined by the appended claims.

What is claimed is:

1. A method for transmitting a signal of a signal transmission apparatus in a communication system, the method comprising:
generating an interleaved vector by channel-interleaving a Low Density Parity Check (LDPC) codeword according to a channel interleaving rule; and
generating a modulation symbol by modulating the interleaved vector according to a modulation scheme;
wherein the channel interleaving rule is one of a first channel interleaving rule and a second channel interleaving rule;
wherein the first channel interleaving rule is a rule for setting degree distribution for nodes in a factor graph of the LDPC codeword separately for individual levels supported by the modulation scheme, wherein the second channel interleaving rule is a rule for allowing coded bits included in the LDPC codeword to be interleaved according to an unequal error characteristic of the modulation scheme.

2. The method of claim 1, further comprising:
performing transmission processing on the modulation symbol and transmitting the processed modulation symbol.

3. The method of claim 1, wherein the second channel interleaving rule is a rule for performing interleaving such that when coded bits included in the LDPC codeword are generated into the modulation symbol, high-error probability coded bits among the coded bits are mapped to bits in low-error probability positions during the generation into the modulation symbol.

4. A method for transmitting a signal of a signal transmission apparatus in a communication system, the method comprising:
generating an interleaved vector by channel-interleaving a Low Density Parity Check (LDPC) codeword according to a channel interleaving rule; and
generating a modulation symbol by modulating the interleaved vector according to a modulation scheme;
wherein the channel interleaving rule is one of a first channel interleaving rule, which is a rule for setting degree distribution for nodes in a factor graph of the LDPC codeword according to the following equation; and
a second channel interleaving rule, which is a rule for performing interleaving such that degree distribution of a subset $C^{(j)}$ of coded bits belonging to a $j^{th}$ level (where j=1, . . . , m) supported by the modulation scheme, among the coded bits included in the LDPC codeword, remains constant after the channel interleaving:

$$\lambda^{(j)}(x) = \sum_{i=2}^{d_v} \lambda_i^{(j)} x^{i-1}$$

where j denotes a number of levels supported by the modulation scheme, $C^{(j)}$ denotes a subset of coded bits belonging to the $j^{th}$ level among the coded bits included in the LDPC codeword, $V^{(j)}$ denotes a subset of variable nodes corresponding to coded bits belonging to $C^{(j)}$, $E^{(j)}$ denotes a set of edges connected to variable nodes belonging to $V^{(j)}$, and $\lambda_i^{(j)}$ denotes a ratio of edges in the set E, connected to a degree-i variable node belonging to $V^{(j)}$.

5. The method of claim 4, wherein the second channel interleaving rule is a degree profile matching channel interleaving rule having degree information, the degree information is $\Lambda=(\lambda^{(1)}, \ldots, \lambda^{(m)})$, $V^{(j)}$ denotes a subset of variable nodes corresponding to coded bits belonging to $C^{(j)}$, and $\lambda^{(j)}$ denotes degree distribution for variable nodes belonging to $V^{(j)}$.

6. The method of claim 5, wherein the degree information $\Lambda$ is set such that $C^{(j)}$ includes a same number of elements.

7. The method of claim 5, wherein the degree information $\Lambda$ has a relationship defined in the following Equation:

$$\sum_{i=2}^{d_v} \lambda_i^{(1)} = \sum_{i=2}^{d_v} \lambda_i^{(2)} = \ldots = \sum_{i=2}^{d_v} \lambda_i^{(m)}$$

where $E^{(j)}$ denotes a set of edges connected to variable nodes belonging to $V^{(j)}$, and $\lambda_i^{(j)}$ denotes a ratio of edges in the set E, connected to a degree-i variable node belonging to $V^{(j)}$.

8. The method of claim 5, wherein the degree information $\Lambda$ is set such that degree distribution of the channel-interleaved vector is equal to degree distribution of the LDPC codeword.

9. The method of claim 5, wherein the degree information $\Lambda$ has a relationship defined by the following Equation:

$$\sum_{j=1}^{m} \lambda_i^{(j)} = \lambda_i$$

where $E^{(j)}$ denotes a set of edges connected to variable nodes belonging to $V^{(j)}$, and $\lambda_i^{(j)}$ denotes a ratio of edges in the set E, connected to a degree-i variable node belonging to $V^{(j)}$.

10. The method of claim 4, further comprising:
performing transmission processing on the modulation symbol and transmitting the processed modulation symbol.

11. A signal transmission apparatus in a communication system, the apparatus comprising:
a channel interleaver for generating an interleaved vector by channel-interleaving a Low Density Parity Check (LDPC) codeword according to a channel interleaving rule; and
a modulator for generating a modulation symbol by modulating the interleaved vector according to a modulation scheme;
wherein the channel interleaving rule is one of a first channel interleaving rule, which is a rule for setting degree distribution for nodes in a factor graph of the LDPC codeword separately for individual levels supported by the modulation scheme; and
a second channel interleaving rule, which is a rule for allowing coded bits included in the LDPC codeword to be interleaved according to an unequal error characteristic of the modulation scheme.

12. The signal transmission apparatus of claim 11, further comprising a transmitter for performing transmission processing on the modulation symbol and transmitting the processed modulation symbol.

13. The signal transmission apparatus of claim 11, wherein the second channel interleaving rule is a rule for performing interleaving such that when coded bits included in the LDPC codeword are generated into the modulation symbol, high-error probability coded bits among the coded bits are mapped to bits in low-error probability positions during the generation into the modulation symbol.

14. A signal transmission apparatus in a communication system, the apparatus comprising:
a channel interleaver for generating an interleaved vector by channel-interleaving a Low Density Parity Check (LDPC) codeword according to a channel interleaving rule; and
a modulator for generating a modulation symbol by modulating the interleaved vector according to a modulation scheme;
wherein the channel interleaving rule is one of a first channel interleaving rule, which is a rule for setting degree distribution for nodes in a factor graph of the LDPC codeword according to the following Equation;

$$\lambda^{(j)}(x) = \sum_{i=2}^{d_v} \lambda_i^{(j)} x^{i-1}$$

where j denotes a number of levels supported by the modulation scheme, $C^{(j)}$ denotes a subset of coded bits belonging to the $j^{th}$ level among the coded bits included in the LDPC codeword, $V^{(j)}$ denotes a subset of variable nodes corresponding to coded bits belonging to $C^{(j)}$, $E^{(j)}$ denotes a set of edges connected to variable nodes belonging to $V^{(j)}$, and $\lambda_i^{(j)}$ denotes a ratio of edges in the set E, connected to a degree-i variable node belonging to $V^{(j)}$; and     a second channel interleaving rule, which is a rule for performing interleaving such that degree distribution of a subset $C^{(j)}$ of coded bits belonging to a $j^{th}$ level (where j=1, . . . , m) supported by the modulation scheme, among the coded bits included in the LDPC codeword, remains constant after the channel interleaving.

15. The signal transmission apparatus of claim 14, wherein the second channel interleaving rule is a degree profile matching channel interleaving rule having degree information, the degree information is $\Lambda=(\lambda^{(1)}, \ldots, \lambda^{(m)})$, where $V^{(j)}$ denotes a subset of variable nodes corresponding to coded bits belonging to $C^{(j)}$, and $\lambda^{(j)}$ denotes degree distribution for variable nodes belonging to $V^{(j)}$.

16. The signal transmission apparatus of claim 15, wherein the degree information $\Lambda$ is set such that $C^{(j)}$ includes a same number of elements.

17. The signal transmission apparatus of claim 15, wherein the degree information $\Lambda$ has a relationship defined by the following Equation:

$$\sum_{i=2}^{d_v} \lambda_i^{(1)} = \sum_{i=2}^{d_v} \lambda_i^{(2)} = \ldots = \sum_{i=2}^{d_v} \lambda_i^{(m)}$$

where $E^{(j)}$ denotes a set of edges connected to variable nodes belonging to $V^{(j)}$, and $\lambda_i^{(j)}$ denotes a ratio of edges in the set E, connected to a degree-i variable node belonging to $V^{(j)}$.

18. The signal transmission apparatus of claim 15, wherein the degree information $\Lambda$ is set such that degree distribution of the channel-interleaved vector is equal to degree distribution of the LDPC codeword.

19. The signal transmission apparatus of claim 15, wherein the degree information $\Lambda$ has a relationship defined in the following Equation:

$$\sum_{j=1}^{m} \lambda_i^{(j)} = \lambda_i$$

where $E^{(j)}$ denotes a set of edges connected to variable nodes belonging to $V^{(j)}$, and $\lambda_i^{(j)}$ denotes a ratio of edges in the set E, connected to a degree-i variable node belonging to $V^{(j)}$.

20. The signal transmission apparatus of claim 14, further comprising a transmitter for performing transmission processing on the modulation symbol and transmitting the processed modulation symbol.

21. A method for receiving a signal in a communication system, the method comprising:

generating a demodulation vector by demodulating a reception vector; and     generating a deinterleaved vector by channel-deinterleaving the demodulation vector using a corresponding channel deinterleaving scheme;

wherein the channel interleaving rule is one of a first channel interleaving rule, which is a rule for setting degree distribution for nodes in a factor graph of a Low Density Parity Check (LDPC) codeword separately for individual levels supported by the modulation scheme; and     a second channel interleaving rule, which is a rule for allowing coded bits included in the LDPC codeword to be interleaved according to an unequal error characteristic of the modulation scheme.

22. The method of claim 21, further comprising:

restoring an information vector by decoding the deinterleaved vector using a decoding scheme corresponding to an LDPC coding scheme used in the signal transmission apparatus.

23. The method of claim 21, wherein the second channel interleaving rule is a rule for performing interleaving such that when coded bits included in the LDPC codeword are generated into the modulation symbol, high-error probability coded bits among the coded bits are mapped to bits in low-error probability positions during the generation into the modulation symbol.

24. A method for receiving a signal in a communication system, the method comprising:

generating a demodulation vector by demodulating a reception vector; and     generating a deinterleaved vector by channel-deinterleaving the demodulation vector using a corresponding channel deinterleaving scheme;

wherein the channel interleaving rule is one of a first channel interleaving rule, which is a rule for setting degree distribution for nodes in a factor graph of a Low Density Parity Check (LDPC) codeword according to the following equation;

$$\lambda^{(j)}(x) = \sum_{i=2}^{d_v} \lambda_i^{(j)} x^{i-1} \qquad (2)$$

where j denotes a number of levels supported by the modulation scheme, $C^{(j)}$ denotes a subset of coded bits belonging to the $j^{th}$ level among the coded bits included in the LDPC codeword, $V^{(j)}$ denotes a subset of variable nodes corresponding to coded bits belonging to $C^{(j)}$, $E^{(j)}$ denotes a set of edges connected to variable nodes belonging to $V^{(j)}$, and $\lambda_i^{(j)}$ denotes a ratio of edges in the set E, connected to a degree-i variable node belonging to $V^{(j)}$; and     a second channel interleaving rule, which is a rule for performing interleaving such that degree distribution of a subset $C^{(j)}$ of coded bits belonging to a $j^{th}$ level (where j=1, . . . , m) supported by the modulation scheme, among the coded bits included in the LDPC codeword, remains constant after the channel interleaving.

25. The method of claim 24, wherein the second channel interleaving rule is a degree profile matching channel interleaving rule having degree information, the degree information is $\Lambda=(\lambda^{(1)}, \ldots, \lambda^{(m)})$, $V^{(j)}$ denotes a subset of variable nodes corresponding to coded bits belonging to $C^{(j)}$, and $\lambda^{(j)}$ denotes degree distribution for variable nodes belonging to $V^{(j)}$.

26. The method of claim 25, wherein the degree information $\Lambda$ is set such that $C^{(j)}$ includes a same number of elements.

27. The method of claim 25, wherein the degree information $\Lambda$ has a relationship defined by the following Equation:

$$\sum_{i=2}^{d_v} \lambda_i^{(1)} = \sum_{i=2}^{d_v} \lambda_i^{(2)} = \ldots = \sum_{i=2}^{d_v} \lambda_i^{(m)}$$

where $E^{(j)}$ denotes a set of edges connected to variable nodes belonging to $V^{(j)}$, and $\lambda_i^{(j)}$ denotes a ratio of edges in the set E, connected to a degree-i variable node belonging to $V^{(j)}$.

28. The method of claim 25, wherein the degree information $\Lambda$ is set such that degree distribution of the channel-interleaved vector is equal to degree distribution of the LDPC codeword.

29. The method of claim 25, wherein the degree information $\Lambda$ has a relationship defined by the following Equation:

$$\sum_{j=1}^{m} \lambda_i^{(j)} = \lambda_i$$

where $E^{(j)}$ denotes a set of edges connected to variable nodes belonging to $V^{(j)}$, and $\lambda_i^{(j)}$ denotes a ratio of edges in the set E, connected to a degree-i variable node belonging to $V^{(j)}$.

30. The method of claim 24, further comprising:
  restoring an information vector by decoding the deinterleaved vector using a decoding scheme corresponding to an LDPC coding scheme used in the signal transmission apparatus.

31. A signal reception apparatus in a communication system, the apparatus comprising:
  a demodulator for generating a demodulation vector by demodulating a reception vector using a corresponding demodulation scheme; and
  a channel deinterleaver for generating a deinterleaved vector by channel-deinterleaving the demodulation vector using a corresponding channel deinterleaving scheme;
  wherein the channel interleaving rule is one of a first channel interleaving rule, which is a rule for setting degree distribution for nodes in a factor graph of a Low Density Parity Check (LDPC) codeword separately for individual levels supported by the modulation scheme; and
  a second channel interleaving rule, which is a rule for allowing coded bits included in the LDPC codeword to be interleaved according to an unequal error characteristic of the modulation scheme.

32. The signal reception apparatus of claim 31, further comprising:
  a decoder for restoring an information vector by decoding the deinterleaved vector using a decoding scheme corresponding to an LDPC coding scheme used in the signal transmission apparatus.

33. The signal reception apparatus of claim 31, wherein the second channel interleaving rule is a rule for performing interleaving such that when coded bits included in the LDPC codeword are generated into the modulation symbol, high-error probability coded bits among the coded bits are mapped to bits in low-error probability positions during the generation into the modulation symbol.

34. A signal reception apparatus in a communication system, the apparatus comprising:
  a demodulator for generating a demodulation vector by demodulating a reception vector using a corresponding demodulation scheme; and
  a channel deinterleaver for generating a deinterleaved vector by channel-deinterleaving deinterleaving the demodulation vector using a corresponding channel deinterleaving scheme;
  wherein the channel interleaving rule is one of a first channel interleaving rule, which is a rule for setting degree distribution for nodes in a factor graph of a Low Density Parity Check (LDPC) codeword according to the following Equation;

$$\lambda^{(j)}(x) = \sum_{i=2}^{d_v} \lambda_i^{(j)} x^{i-1}$$

where j denotes a number of levels supported by the modulation scheme, $C^{(j)}$ denotes a subset of coded bits belonging to the $j^{th}$ level among the coded bits included in the LDPC codeword, $V^{(j)}$ denotes a subset of variable nodes corresponding to coded bits belonging to $C^{(j)}$, $E^{(j)}$ denotes a set of edges connected to variable nodes belonging to $V^{(j)}$, and $\lambda_i^{(j)}$ denotes a ratio of edges in the set E, connected to a degree-i variable node belonging to $V^{(j)}$; and
  a second channel interleaving rule, which is a rule for performing interleaving such that degree distribution of a subset $C^{(j)}$ of coded bits belonging to a $j^{th}$ level (where j=1, . . . , m) supported by the modulation scheme, among the coded bits included in the LDPC codeword, remains constant after the channel interleaving.

35. The signal reception apparatus of claim 34, wherein the second channel interleaving rule is a degree profile matching channel interleaving rule having degree information, the degree information is $\Lambda=(\lambda^{(1)}, \ldots, \lambda^{(m)})$, $V^{(j)}$ denotes a subset of variable nodes corresponding to coded bits belonging to $C^{(j)}$, and $\lambda^{(j)}$ denotes degree distribution for variable nodes belonging to $V^{(j)}$.

36. The signal reception apparatus of claim 35, wherein the degree information $\Lambda$ is set such that $C^{(j)}$ includes a same number of elements.

37. The signal reception apparatus of claim 35, wherein the degree information $\Lambda$ has a relationship defined in the following Equation:

$$\sum_{i=2}^{d_v} \lambda_i^{(1)} = \sum_{i=2}^{d_v} \lambda_i^{(2)} = \ldots = \sum_{i=2}^{d_v} \lambda_i^{(m)}$$

where $E^{(j)}$ denotes a set of edges connected to variable nodes belonging to $V^{(j)}$, and $\lambda_i^{(j)}$ denotes a ratio of edges in the set E, connected to a degree-i variable node belonging to $V^{(j)}$.

38. The signal reception apparatus of claim 35, wherein the degree information $\Lambda$ is set such that degree distribution of the channel-interleaved vector is equal to degree distribution of the LDPC codeword.

39. The signal reception apparatus of claim 35, wherein the degree information $\Lambda$ has a relationship defined in the following Equation:

$$\sum_{j=1}^{m} \lambda_i^{(j)} = \lambda_i$$

where $E^{(j)}$ denotes a set of edges connected to variable nodes belonging to $V^{(j)}$, and $\lambda_i^{(j)}$ denotes a ratio of edges in the set E, connected to a degree-i variable node belonging to $V^{(j)}$.

40. The signal reception apparatus of claim 34, further comprising:
  a decoder for restoring an information vector by decoding the deinterleaved vector using a decoding scheme corresponding to an LDPC coding scheme used in the signal transmission apparatus.

* * * * *